(12) United States Patent
Maier

(10) Patent No.: US 8,269,552 B2
(45) Date of Patent: Sep. 18, 2012

(54) CONTROL PIN POWERED ANALOG SWITCH

(75) Inventor: Erik Maier, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 12/713,032

(22) Filed: Feb. 25, 2010

(65) Prior Publication Data

US 2011/0204955 A1 Aug. 25, 2011

(51) Int. Cl.
*H01L 25/00* (2006.01)
(52) U.S. Cl. ............ 327/564; 327/565; 327/566; 326/37
(58) Field of Classification Search .......... 327/564–566; 326/37
See application file for complete search history.

(56) References Cited

U.S. PATENT DOCUMENTS

| | | | |
|---|---|---|---|
| 4,970,692 A * | 11/1990 | Ali et al. ................. 365/230.06 |
| 4,982,113 A | 1/1991 | Jinbo | |
| 6,005,423 A * | 12/1999 | Schultz ......................... 327/143 |
| 6,060,914 A | 5/2000 | Nunokawa | |
| 6,320,446 B1 | 11/2001 | Podlesny et al. | |
| 6,388,469 B1 | 5/2002 | Hunt et al. | |
| 6,404,237 B1 | 6/2002 | Mathew et al. | |
| 6,894,266 B2 * | 5/2005 | Richard et al. ............ 250/214 R |
| 7,002,400 B2 | 2/2006 | Koo | |
| 7,005,911 B1 | 2/2006 | Om'mani | |
| 7,098,633 B1 | 8/2006 | Brokaw et al. | |
| 7,135,898 B2 * | 11/2006 | Tseng et al. .................. 327/143 |
| 7,378,896 B2 * | 5/2008 | Wong et al. .................... 327/333 |
| 7,626,446 B2 | 12/2009 | Yeh | |
| 7,839,102 B1 | 11/2010 | Rana et al. | |
| 2011/0204960 A1 | 8/2011 | Maier | |

FOREIGN PATENT DOCUMENTS

| | | |
|---|---|---|
| CN | 102170283 A | 8/2011 |
| CN | 102195627 A | 9/2011 |
| KR | 1020110016453 A | 8/2011 |
| KR | 1020110097711 A | 8/2011 |

OTHER PUBLICATIONS

"U.S. Appl. No. 12/713,039, Non Final Office Action mailed May 19, 2011", 12 pgs.
"U.S. Appl. No. 12/713,039, Examiner Interview Summary mailed Nov. 22, 2011", 3 pgs.
"U.S. Appl. No. 12/713,039, Non Final Office Action mailed Dec. 30, 2011", 12 pgs.
"U.S. Appl. No. 12/713,039, Response filed Mar. 30, 2012 to Non Final Office Action mailed Dec. 30, 2012", 12 pgs.
"U.S. Appl. No. 12/713,039, Response filed Nov. 21, 2011 to Non Final Office Action mailed May 19, 2011", 11 pgs.

* cited by examiner

*Primary Examiner* — Kenneth B. Wells
(74) *Attorney, Agent, or Firm* — Schwegman, Lundberg & Woessner, P.A.

(57) ABSTRACT

An apparatus comprises at least one input connection, at least one output connection, and at least one control connection, and at least one switch circuit coupled to the input, the output, and the control connections. The switch circuit passes a signal received at the input to the output when the switch circuit is activated by a control signal received at the control connection. Power to the switch circuit is provided via the control connection.

17 Claims, 4 Drawing Sheets

CONTROL PIN POWERED ANALOG SWITCH

BACKGROUND

An analog switch is often used in electronic circuit designs. An analog switch is used to transmit an analog signal to a circuit path or to prevent an analog signal from being sent to a circuit path. As more and more functionality is expected from electronic devices, there are many advantages to reducing the size of an analog switch.

OVERVIEW

This document relates generally to electronic switches and methods of their implementation. In example 1, an integrated circuit includes at least one input connection, at least one output connection, at least one control connection; and at least one switch circuit coupled to the input, the output, and the control connections. The switch circuit passes a signal received at the input to the output when the switch circuit is activated by a control signal received at the control connection. Power to the switch circuit is provided via the control connection.

In example 2, the integrated circuit of example 1 does not include a separate dedicated power connection.

In example 3, the switch circuit of any one of examples 1 and 2 optionally includes a pass gate. The pass gate is activated by the control signal and wherein power to the pass gate is provided via the control connection.

In example 4, the integrated circuit of any one of examples 1-3 optionally includes a buffer circuit connected between the control connection and the pass gate. Power to the buffer circuit is provided via the control connection.

In example 5, the buffer circuit of example 4 optionally provides an activating trip voltage level greater than a deactivating trip voltage level.

In example 6, the integrated circuit of any one of examples 1-5 optionally includes a buffer circuit connected between the input connection and the pass gate. The buffer circuit is configured to delay a signal received at the input connection relative to the control signal received at the control connection.

In example 7, the integrated circuit any of examples 1-6 optionally includes a four-connector electronic package. The four connectors consist of the input connection, the output connection, the control connection, and a circuit ground connection.

In example 8, the integrated circuit of any one of examples 1-7 optionally includes a plurality of input connection and output connection pairs, and a switch circuit connected between an input connection and output connection pair. Each switch circuit passes a signal received at its input connection to its output connection when the switch circuit is activated by the control connection. Power to the switch circuits is provided by the control connection.

In example 9, the switch circuit of any one of examples 1-8 is optionally configured as a single pole single throw (SPST) switch.

In example 10, the integrated circuit of any one of examples 1-9 optionally includes a plurality of input connection and output connection pairs, a switch circuit connected between an input connection and output connection pair, and a control connection for each switch circuit. Each switch circuit passes a signal received at its input connection to its output connection when the switch circuit is activated by a control signal received at its control connection. Power to each switch circuit is provided by its control connection.

In example 11, a method includes supplying power to a switch circuit exclusively via a control connection. The switch circuit is configured to pass a signal received at an input of the switch circuit to an output of the switch circuit when the switch circuit is activated by the control connection.

In example 12, the method of example 1 includes supplying power to the switch circuit without a separate dedicated power connection.

In example 13, the method of any one of examples 11 and 12 optionally includes packaging the switch circuit in a four connector package.

In example 14, the connectors of the four connector package of example 13 optionally consist of an input connection, an output connection, a control connection, and a circuit ground connection.

In example 15, the method of any one of examples 11-14 optionally includes buffering the control connection and powering the buffering via the control connection.

In example 16, the method of any one of examples 11-15 optionally includes providing hysteresis at the control connection to provide an activating trip voltage level greater than a deactivating trip voltage level.

In example 17, the method of any one of examples 11-16 optionally includes delaying a signal received at the input connection relative to a signal received at the control connection.

In example 18, the method of any one of examples 11-17 optionally includes supplying power to a plurality of switch circuits. Each switch circuit includes a control connection and each switch circuit is configured to pass a signal received at an input of the switch circuit to an output of the switch circuit when the switch circuit is activated by its control connection. Power is supplied to each switch circuit exclusively via its control connection.

In example 19, the supplying power of any one of examples 11-18 optionally includes supplying power to a plurality of switch circuits. The control connection is common to the switch circuits. Each switch circuit is configured to pass a signal received at an input of the switch circuit to an output of the switch circuit when the switch circuit is activated by the common control connection. Power is supplied to the switch circuits exclusively via the control connection.

In example 20, a method includes packaging a switch circuit in a four connector package. The four connectors consist of an input connector, an output connector, an output enable connector, and a circuit ground connector. Power is supplied to the switch circuit using the output enable connector and without using a separate dedicated power connector.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
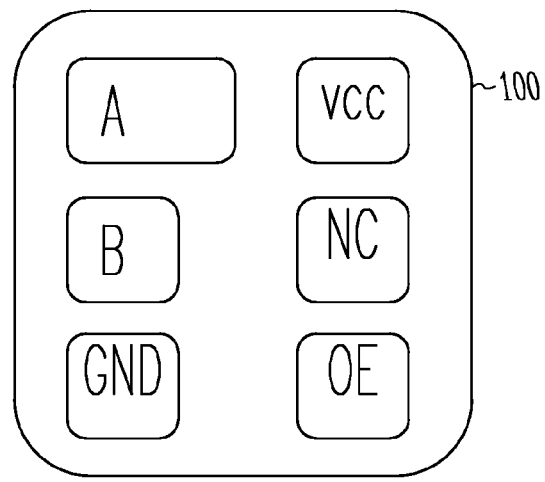
FIG. 1 is an illustration of a typical analog switch package having six leads.

This document relates generally to electronic switches. FIG. 1 is an illustration of a typical analog switch package 100. The packaged analog switch includes five connections or connectors. These connections can be pins or leads of the package for example. The connections labeled A and B designate the input and output of the analog switch. The connection labeled OE designates the output enable or control input of the analog switch. An analog switch typically requires a dedicated supply connection labeled in FIG. 1 as the VCC connection and a circuit ground connection labeled GND in the Figure.

These five connections result in a six lead package for the typical analog switch (e.g., the NC label indicates no connect). The analog switch package 100 is configured as either 2×3 connections or 3×2 connections. The dimensions for a circuit packaged as a six-lead MicroPak, can be 1.0 mm×1.45 mm.

Figure 2:
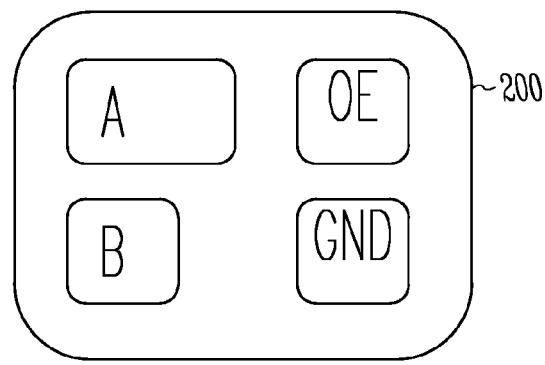
FIG. 2 is an illustration of an example of analog switch package that includes four connections.

FIG. 2 is an illustration of an example of analog switch package 200 that includes four connections: the A, B, OE, and GND connections. The dimensions for an integrated circuit packaged as a four-lead MicroPak, can be 1.0 mm×1.0 mm. This results in smaller footprint for the package and reduced cost.

To provide the same functionality as a five-lead circuit, the switch circuit packaged as in FIG. 2 is powered from the control connection instead of a separate power connection. When the switch circuit is activated by a control signal received at the control connection, power to the switch circuit is provided and the switch circuit passes a signal received at the input to the output. Note that there is not a separate dedicated power connection for the package.

Figure 3:
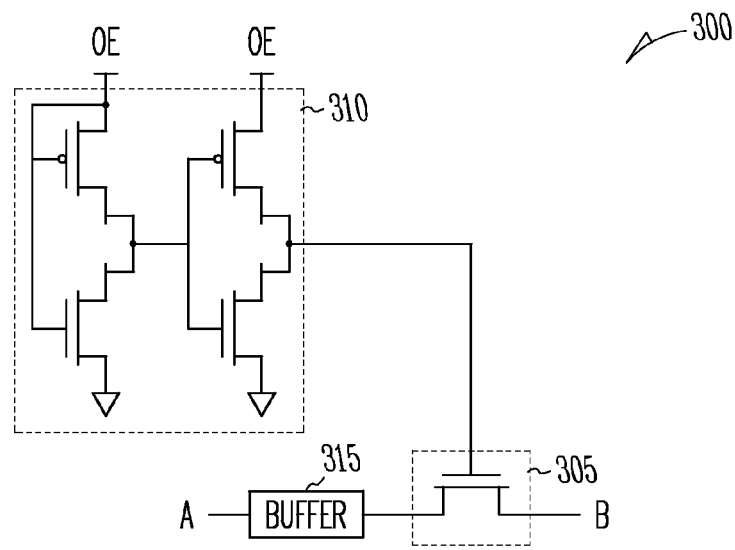
FIG. 3 is a schematic diagram of an example of a switch circuit.

FIG. 3 is a schematic diagram of an example of a switch circuit 300. The switch circuit 300 includes a pass gate 305 coupled to the signal input connection and the signal output connection. In some examples, the pass gate 305 includes a transistor. A first source/drain region of the transistor is coupled to the input connection A and a second source/drain region of the transistor is coupled to the output connection B. The gate of the transistor is coupled to the control connection OE. The pass gate 305 is activated by the control signal and power to the pass gate 305 is provided via the control connection. In some examples, the switch circuit is configured as a single pole single throw (SPST) switch. When an activation signal is present on the control connection (OE), the pass gate 305 is powered and the input (A) is available at the output (B). When the control connection is inactive, the pass gate 305 is not supplied power and the input is not available at the output.

Figure 4:
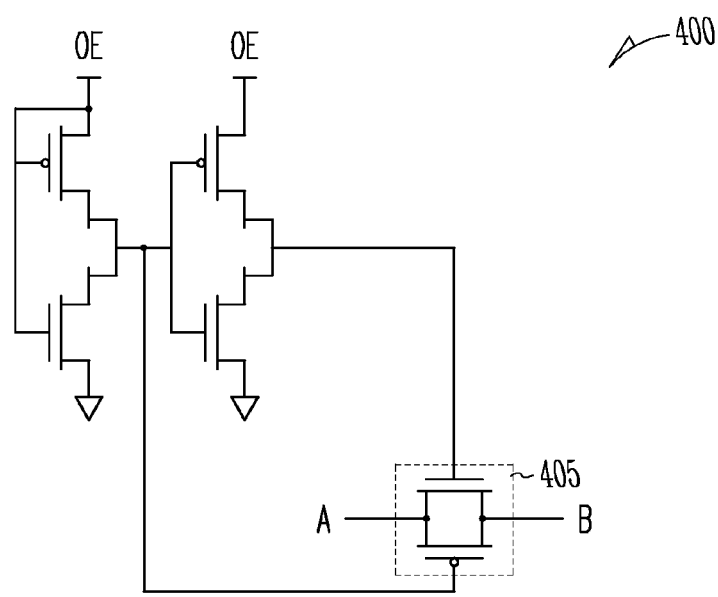
FIG. 4 is a schematic diagram of another example of a switch circuit.

FIG. 4 is a schematic diagram of another example of a switch circuit 400. In this example, the pass gate 405 includes two transistors coupled between the signal input connection and the signal output connection. In some examples, the transistors include a CMOS transistor pair. Bulk connections for the transistors are provided by the control connection and the ground connection. Using a transistor pair may improve the dynamic range of the analog signal passed by the switch circuit 400.

Returning to FIG. 3, the switch circuit 300 includes a buffer circuit 310 connected between the control connection and the pass gate 305. Power to the buffer circuit 310 is provided via the control connection. In certain examples, the buffer circuit provides hysteresis to the control connection. For instance, the hysteresis provides an activating trip voltage level greater than a deactivating trip voltage level. Having hysteresis at the control connection may prevent noise at the control connection from being evident at the output connection.

In certain examples, a buffer circuit (not shown) is connected between the input connection and the pass gate. The buffer circuit is configured to delay a signal received at the input connection relative to the control signal received at the control connection. A time delay at the input may be desired to allow the switch to properly power up before arrival of an input signal. A time delay that is built-in to the switch circuit allows an electronic system designer to not have to be concerned with the timing of arrival of the input and the control signal.

Figure 5:
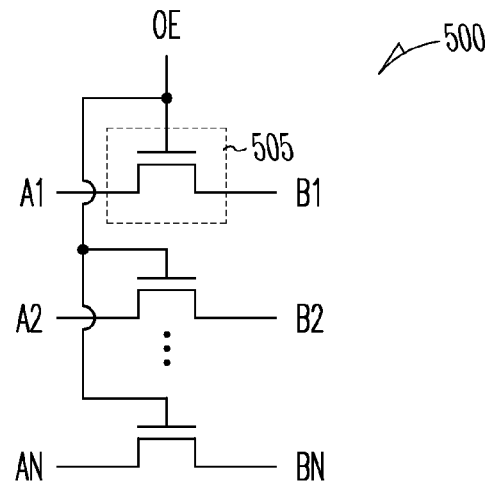
FIG. 5 is a schematic diagram of an example of an electronics circuit that includes multiple switches.

FIG. 5 is a schematic diagram of an example of a circuit 500 that includes multiple switches. The circuit 500 includes a plurality of input connection and output connection pairs. A switch circuit (e.g., a pass gate 505) is connected between an input connection and output connection pair. The circuit 500 may have 1 to N switches where N is a positive integer. The circuit 500 may include a buffer circuit between the control connection and switches to provide enough drive to overcome the capacitive load of the N switches. Each switch circuit of the N switch circuits passes a signal received at its input connection to its output connection when the switch circuit is activated by the control connection. Power to the switch circuits is provided by the one control connection and not by a separate dedicated power connection.

Figure 6:
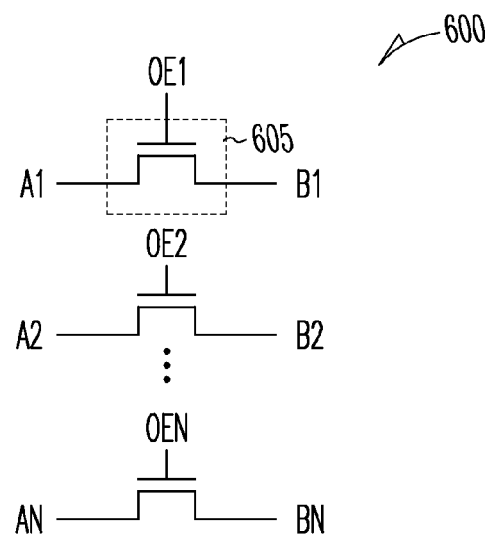
FIG. 6 is a schematic diagram of another example of an electronics circuit that includes multiple switches.

FIG. 6 is a schematic diagram of another example of a circuit 600 that includes multiple switches. In contrast to FIG. 5, the circuit includes a control connection for each switch circuit. In certain examples, a switch circuit includes a pass gate 605. Each switch circuit passes a signal received at its input connection to its output connection when the switch circuit is activated by a control signal received at its control connection. Power to each switch circuit is provided by its own control connection and not by a separate dedicated power connection.

Figure 7:
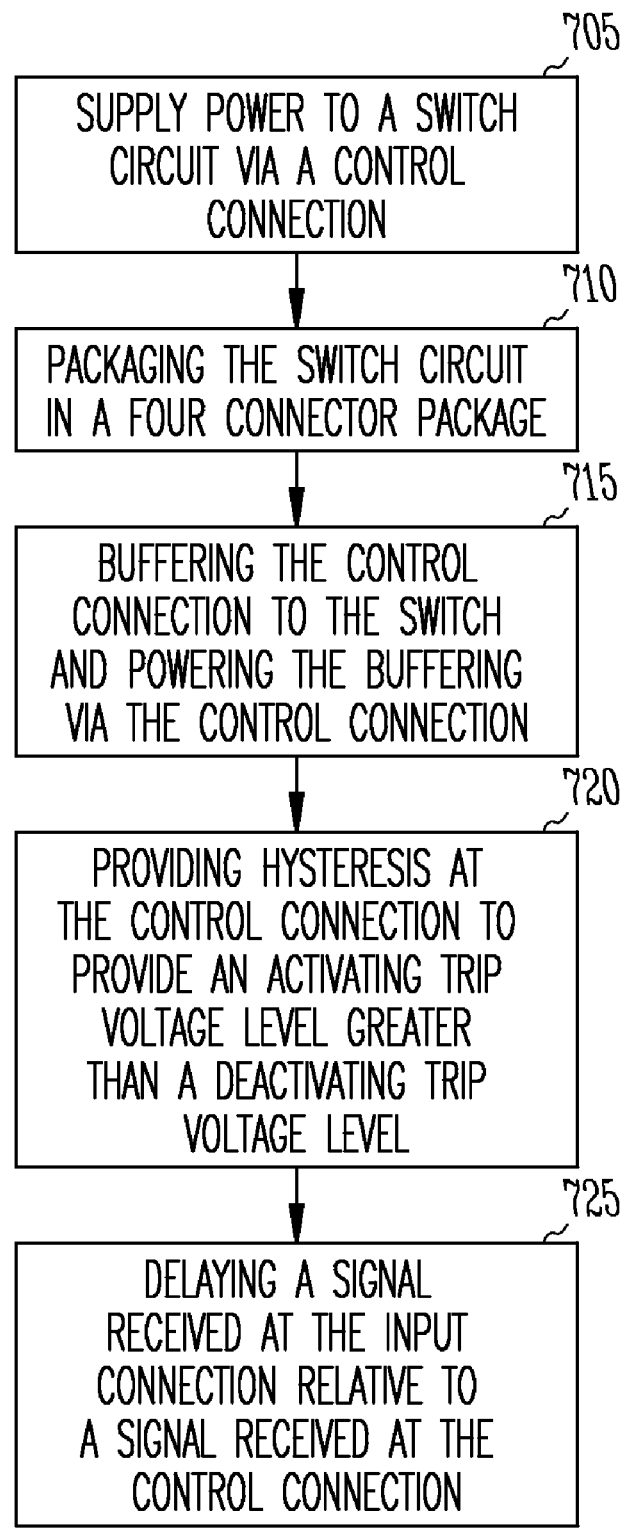
FIG. 7 is a flow diagram of a method of implementing a switch circuit.

FIG. 7 is a flow diagram of a method 700 of implementing a switch circuit. At block 705, power to a switch circuit is supplied exclusively via a control connection. A signal received at an input of the switch circuit is passed to an output of the switch circuit when the switch circuit is activated by the control connection. Power is supplied to the switch circuit without a separate dedicated power connection.

In some examples, the method 700 includes, at block 710, packaging the switch circuit in a four connector package. At block 715, the method 700 includes buffering the control connection to the switch and powering the buffering via the control connection. In certain examples, the method 700, at block 720, includes providing hysteresis at the control connection to provide an activating trip voltage level greater than a deactivating trip voltage level. In certain examples, the method 700, at block 725, includes delaying a signal received at the input connection relative to a signal received at the control connection.

ADDITIONAL NOTES

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An integrated circuit comprising:
   at least one input connection;
   at least one output connection;
   at least one control connection; and
   at least one switch circuit coupled to the input, the output, and the control connections, wherein the switch circuit is configured to pass a signal received at the input to the output when the switch circuit is activated by a control signal received at the control connection, and wherein power to the switch circuit is provided via the control connection, and wherein the switch circuit includes a pass gate, wherein the pass gate is activated by the control signal and wherein power to the pass gate is provided via the control connection; and
   a buffer circuit connected between the at least one input connection and the pass gate, wherein the buffer circuit is configured to delay a signal received at the input connection relative to the control signal received at the control connection.

2. The integrated circuit of claim 1, wherein there is not a dedicated power connection separate from the control connection.

3. The integrated circuit of claim 1, further including a buffer circuit connected between the control connection and the pass gate, wherein power to the buffer circuit is provided via the control connection.

4. The integrated circuit of claim 3, wherein the buffer circuit provides an activating trip voltage level greater than a deactivating trip voltage level.

5. The integrated circuit of claim 1, wherein the integrated circuit is included in a four-connector package, and wherein the four connectors of the four connector package consist of:
   the input connection;
   the output connection;
   the control connection; and
   a circuit ground connection.

6. The integrated circuit of claim 1, including
   a plurality of input connection and output connection pairs; and
   a switch circuit connected between each input connection and output connection pair, wherein each switch circuit passes a signal received at its input connection to its output connection when the switch circuit is activated by the control connection, and wherein power to the switch circuits is provided by the control connection.

7. The integrated circuit of claim 1, wherein the switch circuit is configured as a single pole single throw (SPST) switch.

8. The integrated circuit of claim 1, including:
   a plurality of input connection and output connection pairs;
   a switch circuit connected between each input connection and output connection pair; and
   a control connection for each switch circuit, wherein each switch circuit passes a signal received at its input connection to its output connection when the switch circuit is activated by a control signal received at its control connection, and wherein power to each switch circuit is provided by its control connection.

9. A method comprising:
   supplying power to a switch circuit of an integrated circuit via a control connection, wherein the switch circuit is configured to pass a signal received at an input of the switch circuit to an output of the switch circuit when the switch circuit is activated by the control connection; and
   delaying a signal received at the input connection relative to a signal received at the control connection.

10. The method of claim 9, including supplying power to the switch circuit without a dedicated power connection separate from the control connection.

11. The method of claim 9, including packaging the switch circuit in a four connector package.

12. The method of claim 11, wherein connectors of the four connector package consist of:
   an input connection;
   an output connection;
   a control connection; and
   a circuit ground connection.

13. The method of claim 12, including buffering the control connection and powering the buffering via the control connection.

14. The method of claim 13, including providing hysteresis at the control connection to provide an activating trip voltage level greater than a deactivating trip voltage level.

15. The method of claim 9, wherein supplying power includes supplying power to a plurality of switch circuits, wherein each switch circuit includes a control connection and each switch circuit is configured to pass a signal received at an input of the switch circuit to an output of the switch circuit when the switch circuit is activated by its control connection, and wherein power is supplied to each switch circuit exclusively via its control connection.

16. The method of claim 9, wherein supplying power includes supplying power to a plurality of switch circuits, wherein the control connection is common to the switch circuits, wherein each switch circuit is configured to pass a signal received at an input of the switch circuit to an output of the switch circuit when the switch circuit is activated by the common control connection, and wherein power is supplied to the switch circuits exclusively via the control connection.

17. A method comprising:
packaging a switch circuit and a buffer circuit in a four connector package, wherein the four connectors consist of:
an input connector;
an output connector;
an output enable connector; and
a circuit ground connector;
wherein the switch circuit is configured to pass a signal received at the input connector to the output connector when the switch circuit is activated by a control signal received at the output enable connector;
wherein the buffer circuit is configured to delay the signal received at the input connector relative to the control signal received at the output enable connector; and
wherein power is supplied to the switch circuit using the output enable connector and without using a dedicated power connector separate from the control connection.

* * * * *